United States Patent
Mizuno

(10) Patent No.: US 7,145,416 B2
(45) Date of Patent: Dec. 5, 2006

(54) RESONATOR DEVICE, ELECTRONIC EQUIPMENT PROVIDED WITH RESONATOR DEVICE AND METHOD OF MANUFACTURING RESONATOR DEVICE

(75) Inventor: Shinji Mizuno, Suwa (JP)

(73) Assignee: Seiko Epson Corporation (JP)

( * ) Notice: Subject to any disclaimer, the term of this patent is extended or adjusted under 35 U.S.C. 154(b) by 65 days.

(21) Appl. No.: 10/996,380

(22) Filed: Nov. 23, 2004

(65) Prior Publication Data

US 2005/0116794 A1   Jun. 2, 2005

(30) Foreign Application Priority Data

Dec. 1, 2003   (JP) .............................. 2003-401443

(51) Int. Cl.
*H03H 9/05* (2006.01)
*H01L 41/053* (2006.01)

(52) U.S. Cl. .................. 333/186; 333/193; 310/348

(58) Field of Classification Search ............... 310/351, 310/352, 348; 333/186, 187, 193, 197; 257/784
See application file for complete search history.

(56) References Cited

U.S. PATENT DOCUMENTS

| | | | | |
|---|---|---|---|---|
| 5,430,342 | A * | 7/1995 | Watson | 310/316.01 |
| 6,727,574 | B1 * | 4/2004 | Tomimatsu | 257/666 |
| 6,917,142 | B1 * | 7/2005 | Koyama et al. | 310/344 |
| 7,000,472 | B1 * | 2/2006 | Kinoshita | 73/504.12 |
| 2003/0062631 | A1 * | 4/2003 | Nemoto | 257/787 |

FOREIGN PATENT DOCUMENTS

| | | |
|---|---|---|
| JP | 10-075152 | 3/1998 |
| JP | 11-097474 | 4/1999 |
| JP | 2000-165190 | 6/2000 |

* cited by examiner

*Primary Examiner*—Dean Takaoka
(74) *Attorney, Agent, or Firm*—Harness, Dickey & Pierce, P.L.C.

(57) ABSTRACT

A resonator device includes a resonator supported by a substrate as a base. The resonator is connected to a wire extending from the substrate by wire bonding so as to be suspended in midair and supported over the supporting substrate.

7 Claims, 6 Drawing Sheets

RESONATOR DEVICE, ELECTRONIC EQUIPMENT PROVIDED WITH RESONATOR DEVICE AND METHOD OF MANUFACTURING RESONATOR DEVICE

RELATED APPLICATIONS

This application claims priority to Japanese Patent Application No. 2003-401443 filed Dec. 1, 2003 which is hereby expressly incorporated by reference herein in its entirety.

BACKGROUND

1. Technical Field

The present invention relates to a resonator device including a resonator used for an oscillator and a sensor, electronic equipment provided with the resonator device and a method of manufacturing a resonator device.

2. Related Art

Conventional resonator devices include a resonator serving as an oscillator or a sensor and are applied to various types of electronic equipment.

As this type of a resonator device, a well-known structure includes one type of resonator, such as an AT cut resonator or a tuning folk resonator, supported by a substrate with an Ag paste or a conductive silicon paste and electrically connected.

An Ag paste or a conductive silicon paste, however, has high adhesiveness so as to fix the resonator to the substrate. Thus, the degree of freedom to move in various directions is restricted and vibration is also restricted. This affects the oscillation or vibration characteristics of the resonator.

To attain stable frequency characteristics, a SAW device in which a surface acoustic wave element is suspended by a suspension wire is known (Refer to Japanese Unexamined Patent Application Publication No. 2000-165190).

The above SAW device structure, however, includes lattice like electrodes generating a surface acoustic wave applied by voltage that suspend a substrate, such as a quartz or ceramic substrate, such that the degree of freedom of the lattice like electrodes generating the surface acoustic wave is still restrained. Thus, it is difficult to obtain favorable oscillation or vibration characteristics.

Further, in such a SAW device, a surface acoustic wave is generated on a surface of a substrate, which is fundamentally different from a resonator device that makes a resonator vibrate in all directions while considering the degree of freedom for Coriolis force. Thus, the supporting structure for a SAW device is not appropriate for a resonator device.

The present invention is intended to provide a resonator device eliminating the restrictions of the vibrating directions of a resonator so as to highly improve oscillation and vibration characteristics, electronic equipment provided with the resonator device and a method manufacturing the resonator device.

SUMMARY

In order to attain the above object of the invention, a resonator device of the invention includes a resonator supported by a substrate, wherein the resonator is connected to a wire extending from the substrate by wire bonding so as to be suspended in midair and supported over the substrate.

Thus, a resonator is suspended in midair over the substrate so as to heighten the degree of freedom of directions of vibrations of the resonator. Therefore, the vibration and oscillation characteristics of the resonator are highly improved.

Further, according to the invention, the resonator may be connected to the wire at the center of gravity of the resonator.

Thus, the resonator may be supported by the wire at the center of gravity of the resonator so as to make the resonator stably suspended in midair.

Further, according to the invention, one of the connecting terminals installed in the resonator may be connected to the ends of a plurality of the wires.

Thus, the resonator is supported by a plurality of wires so as to enhance supporting strength without increasing wire size. Namely, as compared to a thick wire for enhancing the supporting wire, stress concentration into the connecting portion due to the lowered flexibility and long operation can be restrained and impact resistivity can be enhanced with high supporting strength. Further, the degree of freedom of vibration directions of the resonator can be improved.

Further, the connecting terminals may be connected to the ends of the wires in parallel toward a plane direction.

Thus, the connecting height of the wires at the connecting terminals can be lowered so as to enhance the supporting strength as well as make the device thinner.

Further, the connecting terminals may be connected to the ends of the wires as well as piled (stacked) with multiple stages.

Thus, the connecting terminals can be small to make the resonator miniaturized and improve supporting strength.

Further, the wire may be a signal line that receives or sends an electrical signal from/to the resonator.

Thus, an individual signal line for sending or receiving electrical signals from/to a resonator is not needed so as to simplify the structure of the device.

Further, the wire may be a ground line of the resonator.

Thus, an individual ground line for the resonator is not needed so as to simplify the structure of the device.

Further, electronic equipment according to the invention is provided with the above resonator device.

Thus, the performance of equipment can be fairly improved by providing a resonator device with superior vibration and oscillation characteristics.

Further, a method of manufacturing a resonator device of the invention, including a resonator supported by a substrate, comprises: temporarily supporting the resonator on the substrate via an adhesive; extending a wire to connect the substrate with the resonator by wire bonding; removing the adhesive thereafter so as to support the resonator in midair above the substrate by the wire.

Thus, a wire is extended to connect the substrate with the resonator supported by a substrate via an adhesive by wire bonding and the adhesive is removed thereafter so as to easily support the resonator in midair above the substrate by the wire. Then, the degree of freedom of the vibrating directions of the resonator can be increased and a resonator device with improved vibrating and oscillating characteristics can be manufactured.

DETAILED DESCRIPTION

Figure 1:
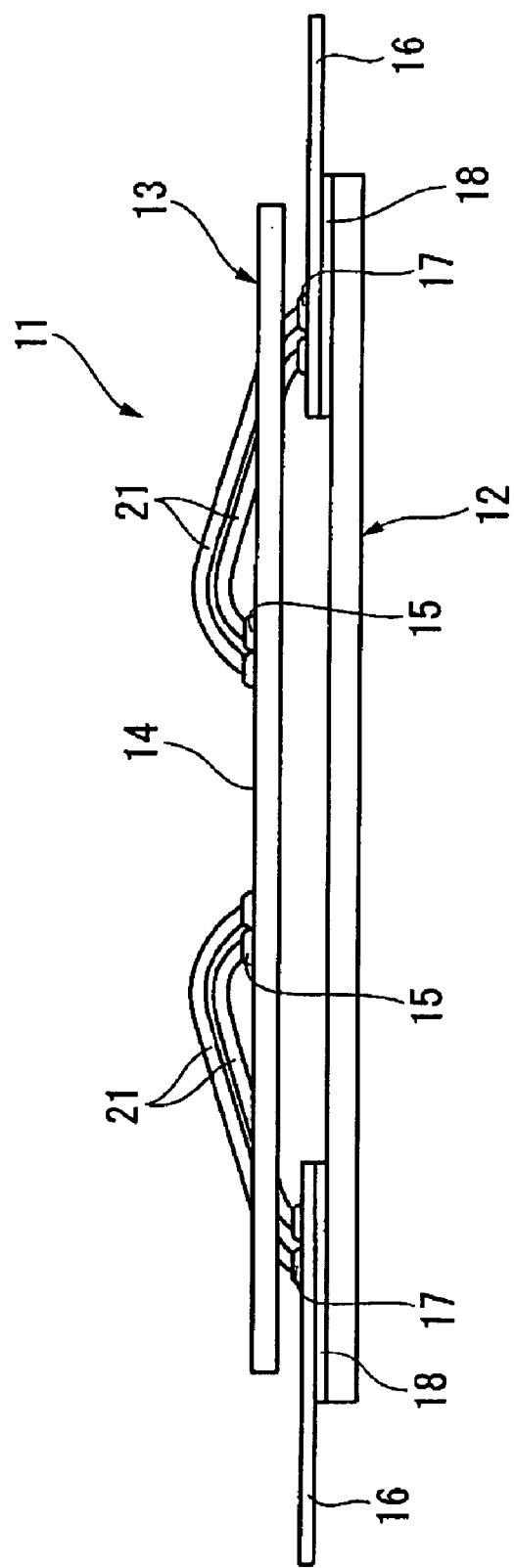
FIG. 1 shows a side view of the resonator device of the present embodiment.
Figure 2:
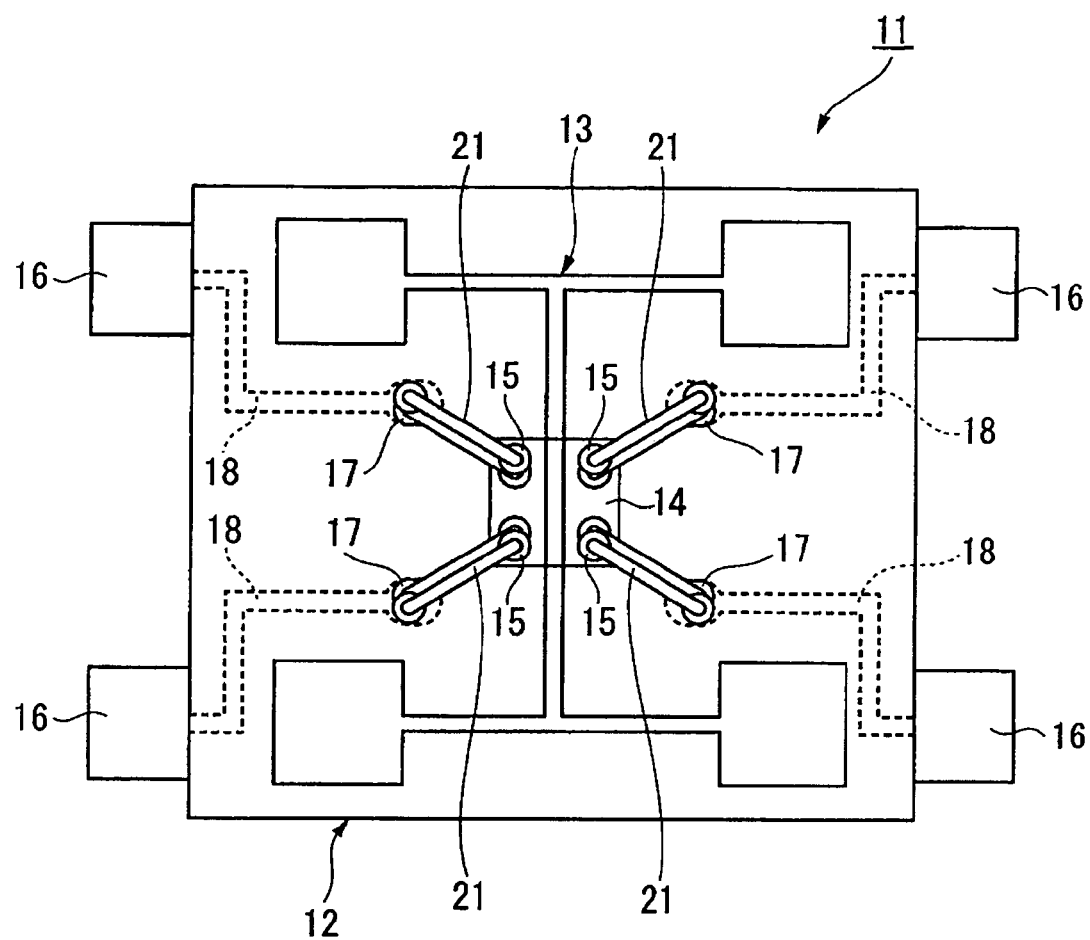
FIG. 2 shows a plan view of the resonator device of the present embodiment.

Embodiments of the invention will now be described with reference to the accompanying drawings. FIG. 1 shows a side view of a resonator device of the present embodiment and FIG. 2 is a plan view of the resonator device.

As shown in the figures, a resonator device 11 comprises a supporting substrate 12 and a resonator 13 that is supported by the supporting substrate 12. The resonator 13 is an H-type as seen in plan view in FIG. 2.

The resonator 13 includes a supporting portion 14 having a quadrate (a rectangular shape) at its gravitational center and the supporting portion 14 is provided with a connecting terminal 15 at each corner on its upper part.

The supporting substrate 12 is composed of a plate shape member made of stainless steel, copper, glass or epoxy resin and a pair of lead portions 16 are installed at each side thereof. Further, a plurality of supporting end portions 17 are installed on the supporting substrate 12 and the supporting end portions 17 are electrically coupled to the lead portions 16 via a wiring pattern 18 formed on the surface of the supporting substrate 12.

Each supporting end portion 17 on the supporting substrate 12 is connected to each end of a plurality of wires 21. Each of the plurality of wires 21 is connected to the connecting terminal portion 15 formed on the supporting portion 14 of the resonator 13. Thus, the resonator 13 is held above the supporting substrate 12 with the wires 21 and is spaced apart from (suspended over) the supporting substrate 12 with a space therebetween.

Namely, the resonator device 11 includes a structure in which the resonator 13 is suspended in midair by the wires over the supporting substrate 12.

Figure 3:
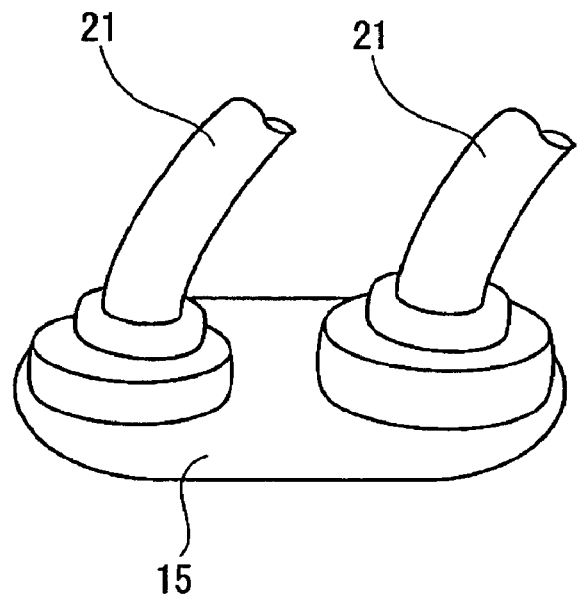
FIG. 3 is a perspective view showing the connection of wires to the connecting terminal.
Figure 4:
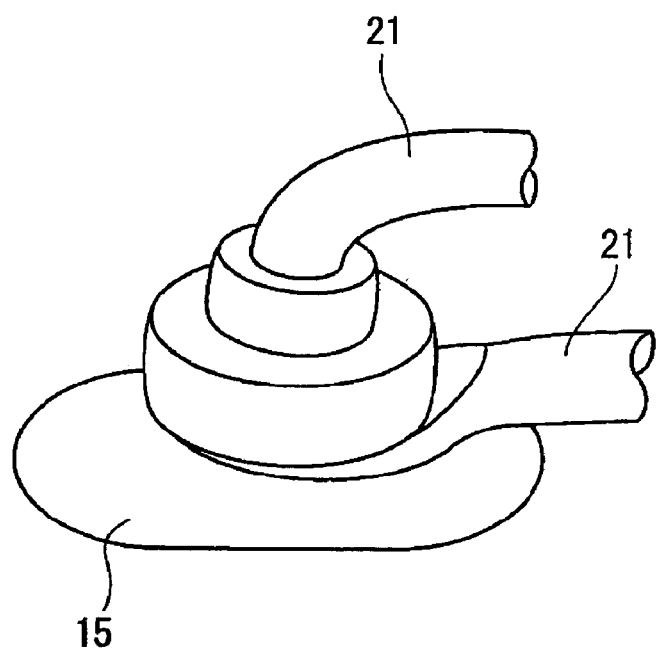
FIG. 4 is a perspective view showing the connection of wires to the connecting terminal.

Further, as shown in FIG. 3, each end of the wires 21 is connected to the connecting terminal portion 15 formed on the supporting portion 14 of the resonator 13 in parallel toward its plane direction.

As for manufacturing the above resonator device 11, first, an adhesive is bonded in the center area of the supporting substrate 12 by pin transferring, a dispenser, or an inkjet so as to make the resonator 13 adhered.

Next, the wires 21 are extended and connected to the supporting end portion 17 and the connecting terminal portion 15 and then the adhesive is melted and removed thereafter.

Thus, the resonator device 11 having a structure in which the resonator 13 is suspended in midair over the supporting substrate 12 can be obtained.

Here, as an adhesive used in manufacturing, a material such as acrylic or epoxy resin which can be hardened by thermal, normal temperature or ultraviolet hardening is preferably used. Further, when removing the adhesive, it is removed by water after wire bonding when the adhesive is water-soluble. On the other hand, the adhesive is removed by dissolving with acetone, glycol ether after wire bonding when the adhesive is non water-soluble.

According to the above structure of the resonator device 11, the resonator 13 is suspended over the supporting substrate 12 at its gravitational center so as to increase the degree of freedom of vibrating directions of the resonator 13. Thus, the vibration and oscillation characteristics can be fairly improved.

Further, according to the method of manufacturing the resonator, the wires 21 are extended to connect the supporting substrate 12 with the gravitational center of the resonator 13 temporarily supported by a substrate via an adhesive by wire bonding and the adhesive is removed thereafter so as to easily support the gravitational center of the resonator 13 above the supporting substrate 12 by the wire in midair. Therefore, the degree of freedom of the vibrating directions of the resonator 13 can be increased and the resonator device 11 having improved vibrating and oscillating characteristics can be manufactured.

Especially, the resonator 13 is supported by a plurality of wires 21 so as to enhance supporting strength without making a single wire thick. Namely, as compared to a thick wire for enhancing supporting strength, stress concentration into the connecting portion due to the lowered flexibility and long operation can be restrained and impact resistivity can be enhanced while providing high supporting strength. Further, the degree of freedom of vibration directions of the resonator 13 can be improved.

Further, each wire 21 is a signal line that receives or sends an electrical signal from/to the resonator or a ground line so as to eliminate the need for an additional signal line or ground line which makes the structure simple.

The resonator having the above structure can be applied to a number of devices including a digital camera, GPS, PDA or a cellar phone as a gyro sensor.

According to an electronic apparatus including the resonator device 11, the performance of the apparatus can be fairly improved by comprising the above device with superior vibration and oscillation characteristics so as to realize high performance while avoiding the blurring of images due to hand movement and a position detecting function.

The way of connecting the wires 21 to the connecting terminal portion 15 supported by the supporting portion 14 of the resonator 13 is not limited to a parallel connection parallel to a plane direction as shown FIG. 3. Rather, the connection may be made by way of connecting the connection end of one of the wires 21 to the connection end of another of the wires 21 as well as being piled (stacked).

When connecting the connection ends of the wires 21 as a pile, a second side serving as a closing end for wire bonding may be connected to the connecting terminal portion 15 and a first side serving as an opening end for wire bonding may be connected as well as piled thereafter.

Here, when a loop of the wires 21 is lowered for thinning, they are connected to the connecting terminal portion 15 in parallel toward a plane direction. When the area of the connecting terminal portion 15 is narrow or the free vibration of the resonator 13 toward a plane direction is disturbed by the wires 21, they may be connected to the connecting terminal portion 15 as well as piled.

In other words, the connecting ends of the wires 21 are connected to the connecting terminal portion 15 in parallel toward a plane direction so as to enhance supporting strength as well as make the device thin by lowering the connection height of the wires 21.

Further, the connecting ends of the wires 21 are connected to the connecting terminal portion 15 as well as piled in multiple stages so as to enhance supporting strength as well as make the device small by miniaturizing the connecting terminal portion 15.

Figure 5:
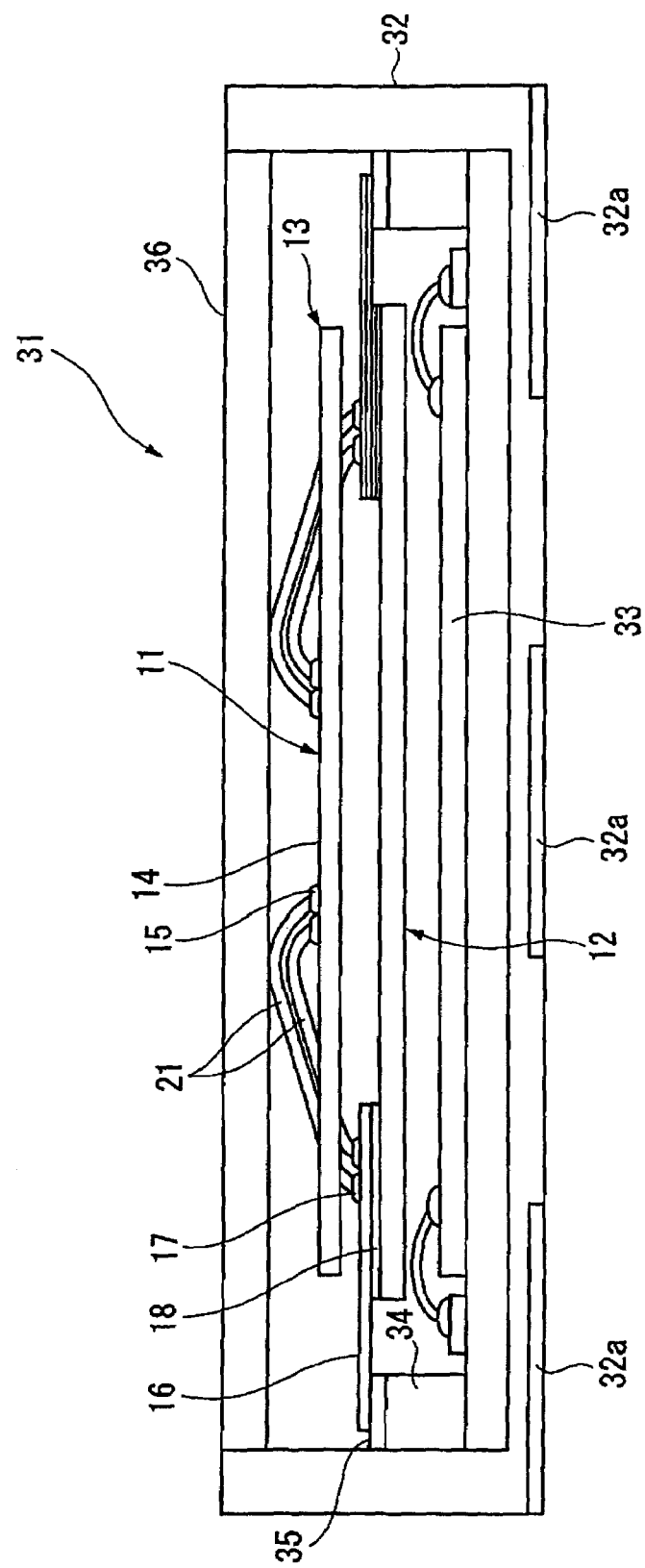
FIG. 5 shows a cross section of a package storing a resonator device.

FIG. 5 shows a package in which the resonator device 11 including the above structure is mounted.

As shown in the figure, in the package 13, a control IC 33 is mounted in a package body 32 and the control IC 33 is connected to the package body 32 by wire bonding. In the package body 32, there is a step portion 34 at both sides of the interior and a connecting terminal 35 at the step portion 35. The lead portion 16 of the resonator device 11 is installed above the step portion 34 and connected to connecting terminal 35 at the step portion 34 so as to be arranged in the package body 32.

In the package body 32, a cap 36 is arranged at the opening placed above from the resonator device 11, which is put in the body so as to seal the inside by the cap 36.

The package body 32 is provided with a plurality of electrodes 32a for electrical connection of various devices in which the package 31 is installed.

In order to form the package 31 to store the resonator device 11 in the package body 32, the control IC 33 is mounted in the package body 32 by die bonding at first. Next, the resonator device 11 is stored in the package body 32 and the lead portion 16 is connected to the connecting terminal 35 at the step portion 34. The cap 36 is fit on the opening of the package body 32 thereafter, the inside of the package body 32 is filled with inactive gas or evacuated through a hole not shown in the figure and connected to the inside.

Here, the lead 16 may be connected to the connecting terminal 35 by epoxy or a silicon type Ag paste for example when mounting the resonator device 11 into the package body 32.

Otherwise, it may be done by single-pointing or gang-bonding the lead 16 with the application of heat and pressure and ultrasonic vibration.

Further, the control IC 33 may be mounted not only by wire boding, but also by flip chip mounting.

Figure 6:
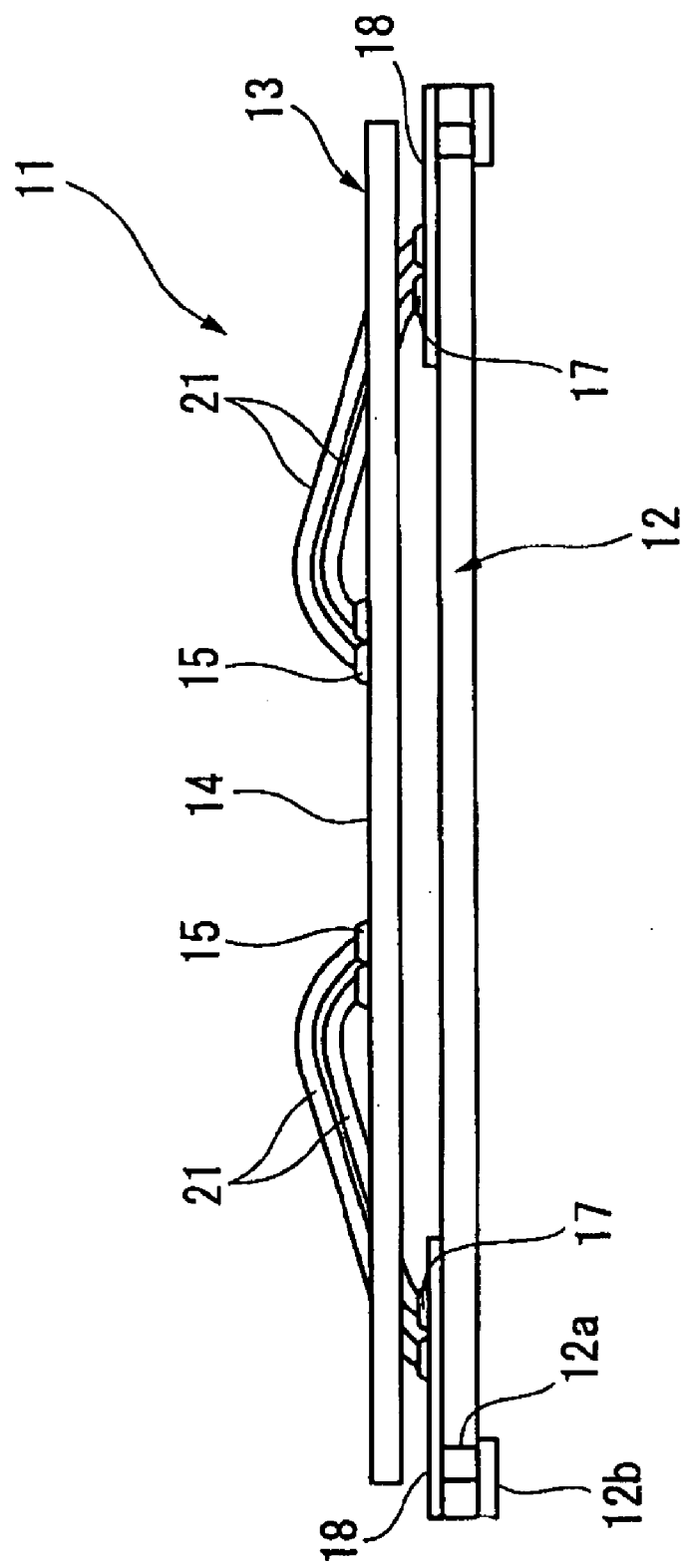
FIG. 6 shows a side view of another structure of a resonator device.
Figure 7:
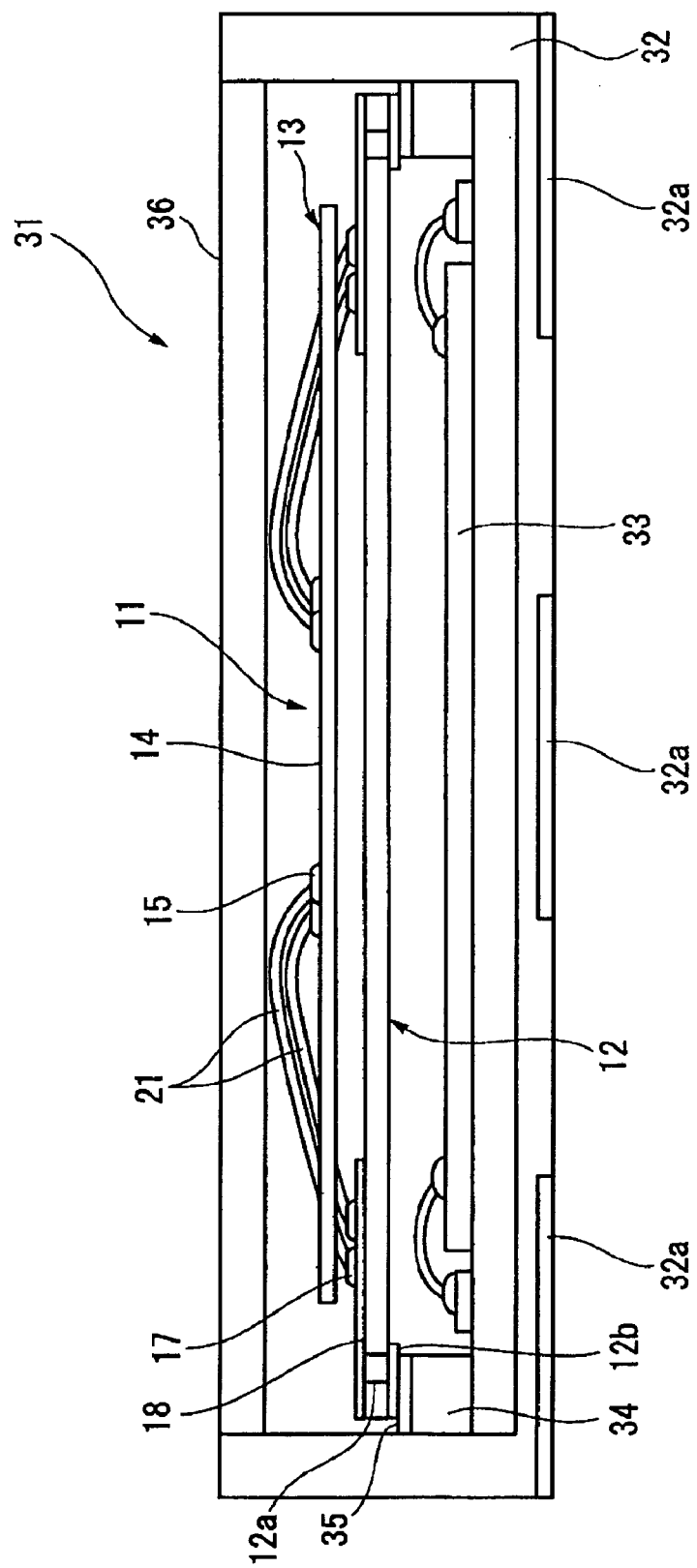
FIG. 7 shows a cross section of a package storing a resonator device.

FIG. 6 shows a resonator device using a supporting substrate composed of a substrate having wiring on both surfaces. FIG. 7 shows a package in which the resonator device using a supporting substrate composed of a substrate having wiring on both surfaces is mounted.

The supporting substrate 12 has a through hole 12a and a connecting pattern 12b formed on the bottom surface is connected to a wiring pattern 18 on the upper surface via the through hole 12a. Here, when the supporting substrate 12 includes a conductive material such as a metal, an insulating layer is formed among the supporting substrate 12 and the wiring pattern 18, the through hole 12a or the connecting pattern 12b.

The resonator device 11 is arranged in the package body 32 by installing the end of the supporting substrate 12 above the step portion 34. The connecting terminal 12b is connected to the connecting terminal 35 on the step portion 34. Here, connection of these connecting terminals 12b and 35 is performed by Ag paste, application of heat and pressure or ultrasonic vibration.

Here, in the above example, the supporting substrate 12 is a base and the resonator 13 is suspended in midair above the supporting substrate 12 as the base.

However, the package body 32 may be a base and the resonator 13 may be suspended in midair directly connecting the package body 32 as the base.

In order to form the structure, the control IC 33 is mounted by flip chip mounting inside the package body 32 at first. Then, the resonator 13 is attached to the control IC 33 with an adhesive so as to connect the package body 32 to the resonator 13 with the wires 21 by wire bonding. An adhesive is removed thereafter so as to make the resonator suspended in midair. Thus, flip chip mounting in which the active surface of the control IC 33 faces the bottom surface, is applied so that an adhesive is not needed for the active surface of the control IC and the lowering of a function of the control IC due to an adhesive can be avoided.

Further, in the above embodiment, an H-type resonator is cited as the resonator 13, but the resonator 13 is not limited to an H-type resonator.

What is claimed is:

1. A resonator device comprising:
   a substrate;
   a plurality of wires extending from the substrate;
   a resonator over the substrate; and
   a connecting terminal of the resonator positioned proximate to a center of gravity of the resonator, the plurality of wires bonded to the connecting terminal to support the resonator by the substrate;
   wherein the resonator is spaced apart from and suspended over the substrate.

2. The resonator device according to claim 1, wherein at least one of the plurality of wires comprises a ground line of the resonator.

3. Electronic equipment provided with the resonator according to claim 1.

4. The resonator device according to claim 1, wherein the plurality of wires are connected to the connecting terminal in parallel.

5. The resonator device according to claim 1, wherein the plurality of wires are connected to the connecting terminal in a stacked configuration.

6. The resonator device according to claim 1, wherein at least one of the plurality of wires comprises a signal line that communicates an electrical signal with the resonator.

7. A method of manufacturing a resonator device including a resonator supported by a substrate, comprising:
   supporting the resonator on the substrate via an adhesive;
   connecting a plurality of wires to the substrate and connecting said plurality of wires to a single connecting terminal of the resonator by wire bonding; and
   thereafter removing the adhesive so that the resonator is spaced apart from and supported above the substrate by the plurality of wires.

* * * * *